United States Patent [19]
Fischer

[11] Patent Number: 5,443,677
[45] Date of Patent: Aug. 22, 1995

[54] APPARATUS FOR MANUFACTURING A SCREEN PRINTING STENCIL

[75] Inventor: Hans Fischer, Worgl, Austria

[73] Assignee: Schablonentechnik Kufstein Ges. m.b.H., Kufstein, Austria

[21] Appl. No.: 318,972

[22] Filed: Oct. 6, 1994

Related U.S. Application Data

[62] Division of Ser. No. 135,528, Oct. 13, 1993, Pat. No. 5,384,007.

[30] Foreign Application Priority Data

Oct. 21, 1992 [EP]  European Pat. Off. ........... 92118032

[51] Int. Cl.⁶ ...................... B44C 1/22; B29C 37/00
[52] U.S. Cl. ..................................... 156/345; 216/65; 216/48
[58] Field of Search .......... 156/345, 643, 659.1, 156/668, 905, 655; 355/104; 430/308, 313, 945

[56] References Cited

U.S. PATENT DOCUMENTS

| | | |
|---|---|---|
| 2,395,448 | 2/1946 | Brennan et al. |
| 2,419,028 | 4/1947 | Norris |
| 4,504,354 | 3/1985 | George et al. ............... 156/905 X |

FOREIGN PATENT DOCUMENTS

| | | |
|---|---|---|
| 0291137 | 5/1988 | European Pat. Off. |
| 0338612 | 4/1989 | European Pat. Off. |
| 2158869 | 10/1972 | France |
| 2320834 | 8/1975 | France |
| 2359088 | 11/1973 | Germany |
| 4106547 | 8/1990 | Japan |

OTHER PUBLICATIONS

Makromolekulare Chemie, BD. 181, pp. 1307–1319, May 2, 1980, Huthig & Wepf Verlag, Basel, Heidelberg, New York.
Makromolekulare Chemie, BD. 191, pp. 963–979, 1990, Huthig & Wepf Verlag, Basel, Heidelberg, New York.
WO A-8 604 549, Jan. 27, 1986 (Abstract).

*Primary Examiner*—William Powell
*Attorney, Agent, or Firm*—Birch, Stewart, Kolasch & Birch

[57] ABSTRACT

The present invention relates to a rotary exposure machine (14), comprising: a guide bed (26); means (15, 16) for rotably supporting a round screen (1) on the guide bed (26); driving means (19, 20) for rotably driving the round screen (1); an optical slide (21) moved along guides (22) while the round screen (1) is turning, the guides (22) are mounted on the guide bed (26); and a laser (27) for exposing a photosensitive coating layer (L) provided on the outer surface of the round screen (1), wherein the laser (27) is carried along with the optical slide (21).

9 Claims, 6 Drawing Sheets

APPARATUS FOR MANUFACTURING A SCREEN PRINTING STENCIL

This application is a divisional of application Ser. No. 08/135,528, filed on Oct. 13, 1993, U.S. Pat. No. 5,384,007, the entire contents of which are hereby incorporated by reference.

The invention relates to a process for manufacturing a screen printing stencil, especially for printing textiles, in accordance with the precharacterizing clause of claim 1.

It had been proposed previously, in order to manufacture a screen printing stencil, to coat a hollow-cylindrical round screen with a photosensitive coating (photoresist) and then, employing an allover film, that is a film covering the entire surface of the screen printing stencil, expose it to light in order thus to cross-link or polymerize the photosensitive coating layer at the exposed positions. In doing so, absorption of a light quantum results at least in the initiation of a polymerization process.

A drawback of this process is the requirement of making an allover film which has a size of approximately 2 m². Furthermore, the surface of the photosensitive coating layer has to be completely dry, since otherwise the film adheres to the coating layer. This considerably reduces the freedom to choose from often very reactive photoresists, since many of these do not dry completely. Finally, in the case of round screens the film has a seam which, in the case of complicated patterns, requires laborious retouching.

The object of the invention is to provide a process for manufacturing a screen printing stencil which does not require employing an allover film when exposing the photosensitive coating layer.

This object is achieved as specified in the characterizing clause of claim 1. Advantageous refinements of the invention are revealed in the subordinate claims.

A process according to the invention for manufacturing a screen printing stencil, especially for printing textiles, is distinguished by the following steps:
 a) forming a hollow-cylindrical round screen,
 b) applying a photosensitive coating layer to the outer surface of the round screen,
 c) location-selective exposure of the coating layer by means of a laser device for the purpose of cross-linking or curing the exposed positions of the coating layer while rotating the round screen, and
 d) developing the coating layer thus exposed.

Since, according to the invention, the previously customary exposure with the aid of conventional lamps across said allover film has now been replaced by a laser device which exposes the photosensitive coating layer, which is to be crosslinked, point-wise at the positions to be crosslinked as defined by the pattern, there is, first of all, the major advantage of saving film. This means not only a reduction in cost but also that it is now possible to use tacky but, on the other hand, very sensitive photosensitive coating layers, which would otherwise inevitably stick to the film. In addition, the process according to the invention precludes incorrect exposures, caused by imperfect contact of the allover film on the photosensitive coating layer, for example due to small gas or air cushions, which cannot be removed in time or are formed in the process, between the allover film and the round screen. Laborious pattern retouching after the exposure is likewise no longer required since, as mentioned in the introduction, a seam is no longer produced.

With the aid of the process according to the invention it is possible to manufacture both round stencils and flat stencils. The manufacture of round stencils makes use of round screens which are circular wire-fabric cylinders or very thin-wall perforated hollow cylinders produced by electroforming. Flat screens are planar screens which are clamped in a frame. So as to be able to pattern them according to the invention, they are placed onto a thin, circular hollow-section pipe in order to form a round screen and are then worked as required.

The photosensitive coating layer is applied by means of a doctor ring which is drawn across the round screen in an axial direction. Alternatively, the photosensitive coating layer may be applied by spraying on the coating by means of an atomizing nozzle while rotating the round screen, to which end the round screen is clamped in a rotary appliance, in whose axial direction the atomizing nozzle is moved.

According to the invention, in order to form the photosensitive coating layer, a monomer containing a photoinitiator is applied. If the photosensitive coating layer is to be irradiated with laser radiation having a desired wavelength, the properties of the layer must be chosen in such a way that a polymerization process can be started at this wavelength. Particular effectiveness in this context is shown by photoinitiators, which, in order to act as effectively as possible, must have an absorption behaviour tailored to the irradiation source and at the same time be highly sensitive to light, and which should be present in application concentrations as low as possible, so as not to adversely affect desired physical properties of the photosensitive coating layer, such as adhesion on the screen surface, wear resistance and the like. Said photoinitiators initiate the polymerization process which, once it has started, continues by itself, or they act in the manner of a catalyst. Said properties may, however, also be influenced by the monomers chosen, one aspect to be particularly considered being the resistance to chemicals.

According to the invention, a monomer is used which contains urethane diacrylates and/or methacrylates. This makes it possible to achieve particularly good characteristics of the photosensitive coating layer with respect to adhesion, wear resistance and resistance to chemicals.

If the photosensitive coating layer is to be irradiated with UV radiation, particularly good results with respect to photosensitivity are achieved if the abovementioned monomer is admixed with the following photoinitiators, individually or in combination:
 1. from 1 to 4% by weight of 2-benzyl-2-dimethylamino-1-(4-morpholinophenyl)butan-1-one, optionally mixed with from 1 to 3% by weight of 1-hydroxycyclohexyl phenyl ketone;
 2. 2-Hydroxy-2-methyl-1-phenylpropan-1-one;
 3. Mixture of 1-hydroxycyclohexyl phenyl ketone and benzophenone;
 4. 2-Methyl-1-(4-(methylthio)phenyl)-2-morpholinopropan-1-one.
 5. 2,2-Dimethoxy-1,2-diphenylethan-1-one.

A further particularly suitable polymer system to be mentioned is polyphthalaldehyde with an aryl onium salt as a photoinitiator.

The abovementioned photosensitive coating layers have, especially in the UV region from 200 nm to 450 nm, a photosensitivity sufficient for said purposes. Thus adequate-exposure of layers of said type, having a thickness of from 10 to 20 μm, was possible, using a laser output power of 1.5 mJ/cm² and a laser wavelength of 350 nm.

According to a refinement of the process according to the invention, the coating layer is dried prior to exposure. To this end the round screen, for the purpose of drying the coating layer, can be positioned so that its longitudinal axis is vertical or be clamped in a rotary appliance, so that the round screen, while the coating layer is drying, is positioned horizontally and can be rotated about its longitudinal axis.

Adhesion of the photosensitive coating layer on the metallic substrate is enhanced by elevated temperatures, although this does also carry the risk of the optical resolving power being reduced. Drying of the coating layer is therefore preferably carried out temperatures in the range from 60° to 150° C., thus achieving an optimum compromise between adhesion and resolving power.

Development of the exposed coating layer is preferably effected by using an alkaline solution, for example a soda solution, aqueous potassium hydroxide or aqueous sodium hydroxide. Unused developer solution can be sprayed, for example, onto the stencil, while the latter is partially immersed in a developer bath and is rotated.

According to a further refinement of the invention, the round screen can be clamped in a rotary appliance and the coating layer, while the round screen is rotated, in successive steps is then applied, dried if required, exposed and developed. All the operations can therefore be carried out while the round screen is clamped in the rotary appliance, without having to be transferred from one processing station to the next between the individual process steps. Stencils of said type can therefore be manufactured particularly rapidly and without serious risk of damage, so that the reject rate can be considerably reduced.

BRIEF DESCRIPTION OF THE DRAWINGS

The invention is explained below in more detail with reference to the drawing, in which.

The invention is described in more detail with reference to FIGS. 1 to 7.

Figure 1:
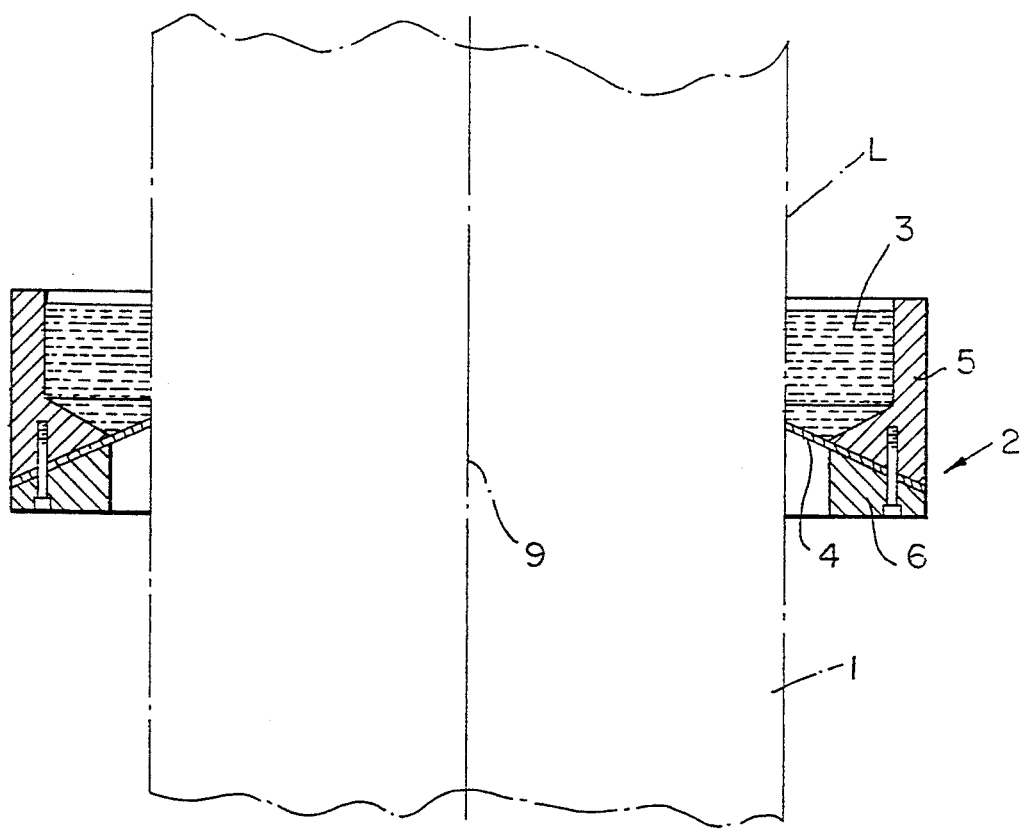
FIG. 1 shows a process step for coating a hollow-cylindrical round screen with a photosensitive coating layer.
Figure 2:
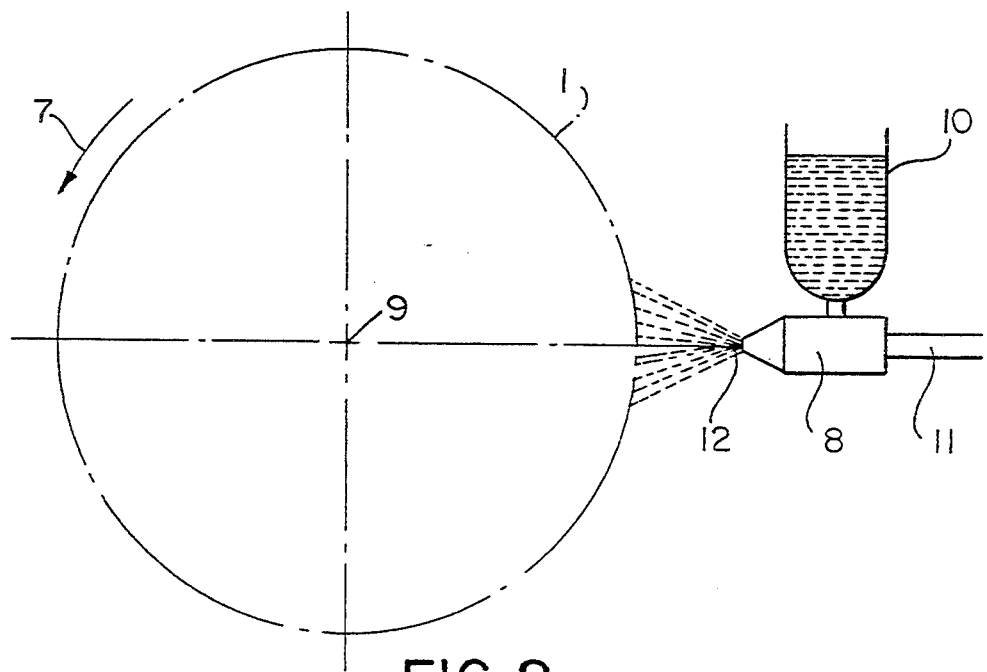
FIG. 2 shows a corresponding process step in which, however, the photosensitive coating layer is sprayed onto the round screen.

FIG. 1 shows a round screen 1 which, employing a doctor ring 2, is coated with a liquid photopolymer. The liquid photopolymer is placed in an annular vat 3 and, thanks to a rubber lip 4 in sealing contact with the round screen 1, cannot flow out of the vat 3. The rubber lip 4 is retained between a doctor ring upper part 5 and a doctor ring lower part 6. The photopolymer has roughly the viscosity of a viscous engine oil and, owing to a downward movement of the doctor ring 2, cannot flow through the round screen 1 into the interior thereof. The reason for this is that the static pressure experienced by the viscous photopolymer corresponds only to the liquid level in the vat 3 of the doctor ring 2 and is therefore very low. Moreover, said static pressure acts on a longitudinal section of the round screen 1 for only a very short time, specifically for that length of time required by the doctor ring 2 owing to its downward velocity, to pass through the height of the liquid level in the vat 3.

The round screen 1 is so close-meshed or has pores which are so small, that the low static pressure, on the one hand, is sufficient to push the polymer, within the time available, into the pores and to fill these, but on the other hand is not sufficient to overpressurize and thus tear the liquid membrane forming in each small capillary pore against the interior of the round screen 1. Consequently, it is virtually impossible for the photopolymer to escape into the interior of the round screen 1, even if the lowering rate of the doctor ring 2 is reduced.

The lowering rate of the doctor ring 2 is selected in such a way that the polymer layer remaining on the round screen 1 has the desired thickness. The thickness of the photopolymer layer in this process is increased if the doctor ring 2 is lowered rapidly, whereas the thickness becomes smaller, the slower the downward movement of the doctor ring 2 chosen. This is understandable, considering the fact that the photopolymer is a solution of (photosensitive) resins in a readily evaporating solvent. The round screen 1 drawn from the vat 3 entrains a correspondingly thick liquid film. The innermost layer of this liquid film adheres to the round screen 1, while the outer layers of the liquid film, owing to their weight, flow back downwards into the vat 3, the outermost layers flowing back the most rapidly.

During this process, the solvent evaporates. The thinner the liquid layer has become, the stronger are the specific solvent losses of the remaining layer and thus its viscosity increase, as the amount of the evaporating solvent per unit of time depends only on the ambient temperature and the surface area and thus remains essentially constant.

Finally, such a high viscosity is reached that the velocity of the outermost layers flowing downwards corresponds to the lowering rate and thus the photopolymer can no longer reach the vat 3. This coating process therefore results in uniform thicknesses of the photopolymer layer even if the surface of the round screen 1 is not precisely circular-cylindrical but instead, for example, is slightly dented.

Alternatively, however, coating of the round screen 1, if according to FIG. 1 it is rotated in the direction of the arrow 7, can be carried out by means of an atomizing nozzle 8. In doing so, the atomizing nozzle 8 is moved in the direction of the longitudinal axis 9 of the round screen 1. The photopolymer, which is held in a beaker 10 above the atomizing nozzle 8, is drawn in from the beaker 10 via an injector-like device in the interior of the atomizing nozzle 8 and is ejected, by means of the compressed air which operates the injector and which is supplied by a hose 11, through a mouthpiece 12 of the atomizing nozzle 8 and there is atomized in a manner known per se. This is achieved, e.g., by an air jet which is under an overpressure of more than 2 bar and in which intense ultrasonic waves arise by which the photopolymer is broken down into extremely small liquid particles. Owing to the rotational movement of the round screen 1 and the simultaneous feed movement of the atomizing nozzle 8 in the axial direction of the round screen 1, the photopolymer mist is distributed uniformly on the surface of the round screen 1.

As has already been mentioned in the introduction, instead of a round screen 1 it is also possible to use a flat screen which is mounted on a circular-cylindrical support tube, e.g. by means of adhesive tapes.

A photosensitive coating layer (resin system) which is especially suitable for ultraviolet (UV) laser irradiation contains the following components:
Monomer:
Urethane diacrylates and methacrylates:
Photoinitiator:
from 1% to 4% of 2-benzyl-2-dimethylamino-1-(4-morpholinophenyl)-butan-1-one optionally mixed with from 1 to 3% of 1-hydroxycyclohexyl phenyl ketone
Other suitable photoinitiators are:
1) 2-Hydroxy-2-methyl-1-phenylpropan-1-one
2) Mixture-of: 1-hydroxycyclohexyl phenyl ketone benzophenone
3) 2-Methyl-1-(4-(methylthio)phenyl)-2-morpholinopropan-1-one.
4) 2,2-Dimethoxy-1,2-diphenylethan-1-one In addition to these, the following components can be used to compose the photosensitive coating layer:
Monomers:
t-butyl acrylate and methacrylate
1,5-pentanediol diacrylate and dimethacrylate
N,N-diethylaminoethyl acrylate and methacrylate
ethylene glycol diacrylate and dimethacrylate
1,4-butanediol diacrylate and dimethacrylate
diethylene glycol diacrylate and dimethacrylate
hexamethylene glycol diacrylate and dimethacrylate
1,3-propanediol diacrylate and dimethacrylate
decamethylene glycol diacrylate and dimethacrylate
1,4-cyclohexanediol diacrylate and dimethacrylate
2,2-dimethylolpropane diacrylate and dimethacrylate
glycerol diacrylate and dimethacrylate
tripropylene glycol diacrylate and dimethacrylate
glycerol triacrylate and trimethacrylate
trimethylolpropane triacrylate and trimethacrylate
pentaerythritol triacrylate and trimethacrylate
polyoxyethylated trimethylolpropane triacrylate and trimethacrylate
2,2-bis(p-hydroxyphenyl)-propane diacrylate
pentaerythritol tetraacrylate and tetramethacrylate
2,2-bis(p-hydroxyphenyl)-propane dimethacrylate
triethylene glycol diacrylate
polyoxyethyl-2,2-bis(p-hydroxyphenyl)-propane dimethacrylate
bis(3-methacryloxy-2-hydroxypropyl) ether of bisphenol A
bis(2-methacryloxyethyl) ether of bisphenol A
bis(3-acryloxy-2-hydroxypropyl) ether of bisphenol A
bis(3-methacryloxy-2-hydroxypropyl) ether of bisphenol A
triethylene glycol dimethacrylate
polyoxypropyltrimethylolpropane triacrylate
butylene glycol diacrylate and dimethacrylate
1,2,4-butanetriol triacrylate and trimethacrylate
2,2,4-trimethyl-1,3-pentanediol diacrylate and dimethacrylate
1-phenylethylene-1,2-dimethacrylate
diallyl fumarate
styrene
1,4-benzenediol dimethacrylate
1,4-diisopropenylbenzene
1,3,5-triisopropenylbenzene
Particularly preferred monomers are:
ethoxylated trimethylolpropane triacrylate
ethylated pentaerythritol triacrylate
dipentaerythritol monohydroxypentaacrylate
1,10-decanediol dimethacrylate
bis(3-acryloxy-2-hydroxypropyl) ether of bisphenol A oligomers
bis(3-methacryloxy-2-hydroxyalkyl) ether of bisphenol A oligomers
urethane diacrylates and methacrylates and oligomers thereof
caprolactone acrylates and methacrylates
propoxylated neopentyl glycol diacrylate and methacrylate and mixtures thereof
Photoinitiators which can be used are:
vicinal ketaldonyl alcohols (benzoin, pivaloin)
acyloin ethers (benzoin methyl ether, benzoin ethyl ether)
benzil dimethyl ketal
a-hydrocarbon substituted aromatic acyloins
a-methylbenzoin
a-allylbenzoin
a-phenylbenzoin
1-hydroxycyclohexyl phenyl ketone
diethoxyphenylacetophenone
2-methyl-1-(4-(methylthio)phenyl)-2-morpholinopropan-1-one
benzophenone
acryloxybenzophenone
o-methoxybenzophenone
2,4,5-triphenylimidazolyl dimers with hydrogen donors
dyes of the phenazine, oxazine and quinone class
Michler's ketone
methyl ethyl ketone
anthraquinone
9,10-anthraquinone
2-methylanthraquinone
2-ethylanthraquinone
2-tert-butylanthraquinone
octamethylanthraquinone
1,4-naphthoquinone
9,10-phenanthraquinone
benz(a)anthracene-7,12-dione
2,3-naphthacene-5,12-dione
2-methyl-1,4-naphthoquinone
1,4-dimethylanthraquinone
2-phenylanthraquinone
acenaphthenequinone
2,3-diphenylanthraquinone
retenequinone
7,8,9,10-tetrahydronaphthacene-5,12-dione
1,2,3,4-tetrahydrobenz(a)anthracene-7,12-dione
alpha-amino aromatic ketones
trichloromethyl-substituted cyclohexadienone
triazine
acetophenone
chlorinated acetophenones.

In the next process step, the photosensitive coating layer is dried as completely as possible, i.e. the solvent is evaporated which had to be introduced into the photopolymer for technical reasons. To this end, the stencils, which had been predried in air during the coating process, are post-dried in a warm-air oven, so that no solvent residues remain in the layer. At the same time, important characteristics are brought about or at least affected by this drying process. Adhesion of the photosensitive coating layer on the metallic substrate, that is on the round screen 1, is enhanced by elevated temperatures, although at the same time optical resolving power is reduced. Drying is therefore carried out at temperatures between 60° C. and 150° C. and, in order to obtain said characteristics uniformly, has to be carried out very carefully in terms of time and temperature. In the case of coating layers which, for final cross-linking, require a monomer, it is necessary to take into account, during the drying process, that the monomer must not evaporate or do so only to a very small extent. In this case, the photopolymer will of course remain liquid, which results in a tacky surface of the coating layer. The viscosity of this layer is however set very high, by evaporating the diluents, and in addition, the rheological characteristic of the layer can be set, by means of suitable additives or fillers, to be thixotropic, so that the polymer layer which is not yet cross-linked, cannot flow away.

Depending on the condition of the polymer layer, drying will now be carried out either in such a way, that the round screen 1 is placed in the drying oven, i.e. that the axis 9 of the round screen 1 runs vertically, or, if the viscosity of the coating layer is lower, the round screen 1 is pushed onto horizontal mandrels which, if required, are even made to rotate, so that the polymer layer at the beginning of the drying process is prevented from flowing away.

Based on FIGS. 3 to 6, the following process step, that of exposure with the aid of a laser, is described. By means of this laser, the photopolymer layer to be cross-linked is exposed and thus solidified point-wise at the locations to be cross-linked as defined by the pattern. These locations will subsequently remain behind after the photopolymer layer has been developed.

A round mould 13, to be understood either as the round screen 1 coated with photopolymer or the flat screen mounted on a support tube and likewise coated with photopolymer, is inserted in a rotary exposure machine 14 between a chuck 15 and a tailstock 16. As a result of closing the chuck 15, the round mould 13 has a rotary position encoder 17 linked to it in a torsion-proof manner. The latter is disposed on the right-hand side of a headstock 18 of the rotary exposure machine 14. The rotary drive of the round mould 13 and of the parts of the system linked thereto is effected by a main drive motor 19 via a vibration-damped V-belt drive 20. While the round mould 13 is turning, an optical slide 21 is moved along guides 22 with the aid of a feed screw 23 and a step motor 24 coupled thereto. On the right-hand shaft end of the step motor 24, a torsional-vibration damper 25 is mounted. The guides 22 and the feed screw 23 are mounted on a guide bed 26 of the rotary exposure machine 14.

Figure 3:
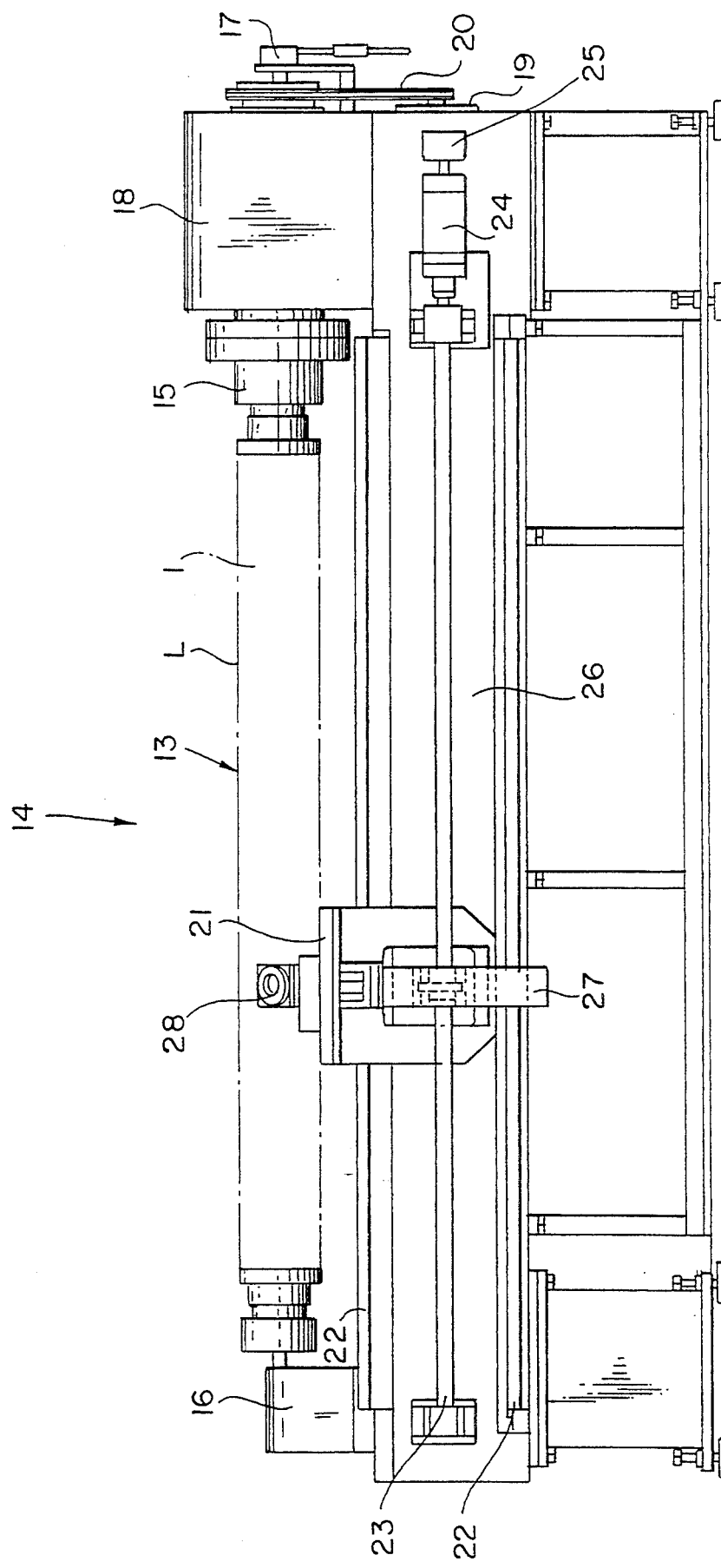
FIG. 3 shows an exposure device for exposing the photosensitive coating layer.
Figure 4:
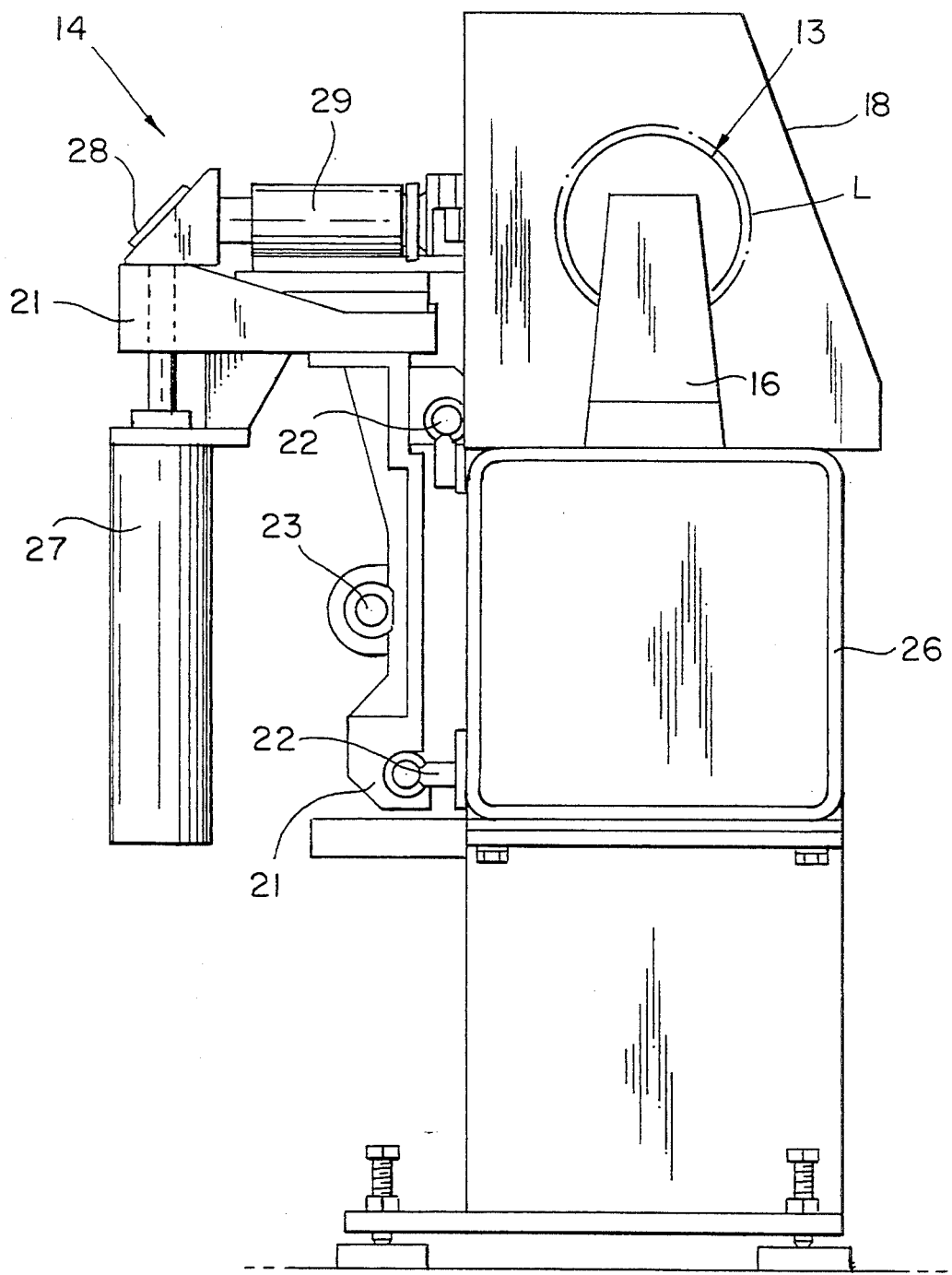
FIG. 4 shows a side view of the exposure device according to FIG. 3.

In the FIGS. 3 and 4, an argon laser 27 carried along with the optical slide 21 is present, whose laser beam is deflected, via a tilted mirror 28, from the originally vertical direction into a horizontal direction, so that it is then focused, via UV optics 29, radially onto the surface of the round mould 13.

So as to stabilize the stencil wall in a radially tangential direction, guide elements (rollers, slideways) may be provided, but this is of course possible only for those photopolymers which have a dry, i.e. solid surface even in the non-cross-linked state.

Figure 5:
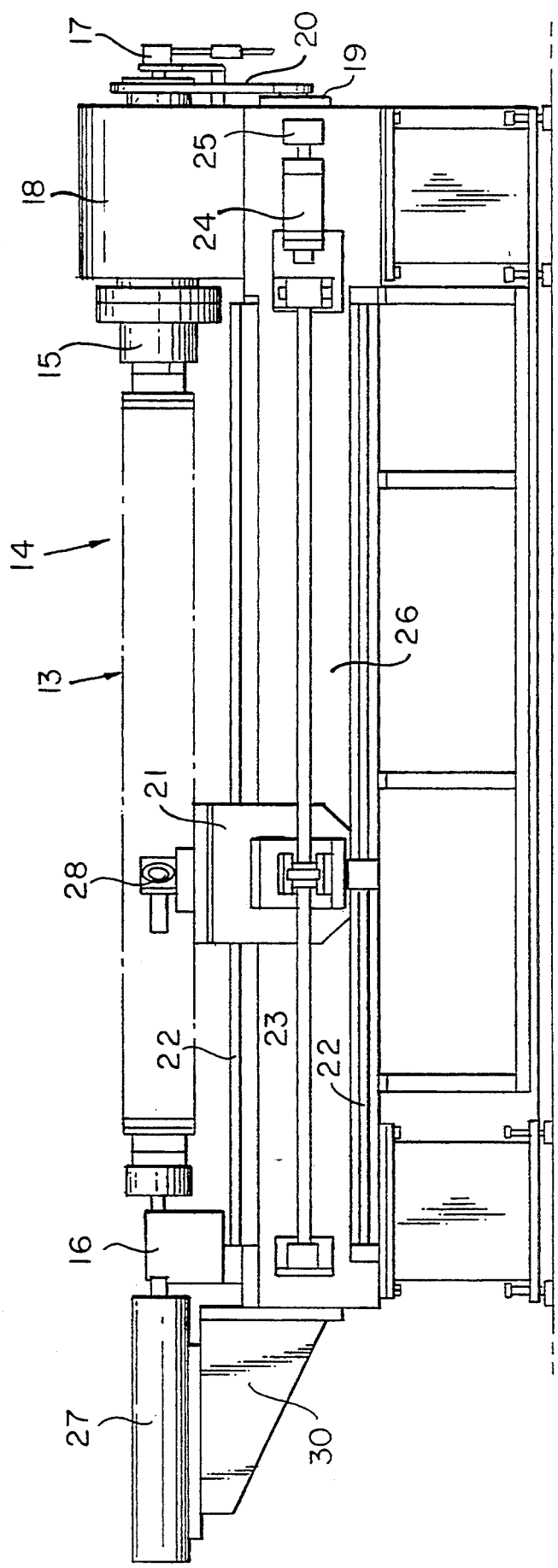
FIG. 5 shows a further exposure device for exposing the photosensitive coating layer.
Figure 6:
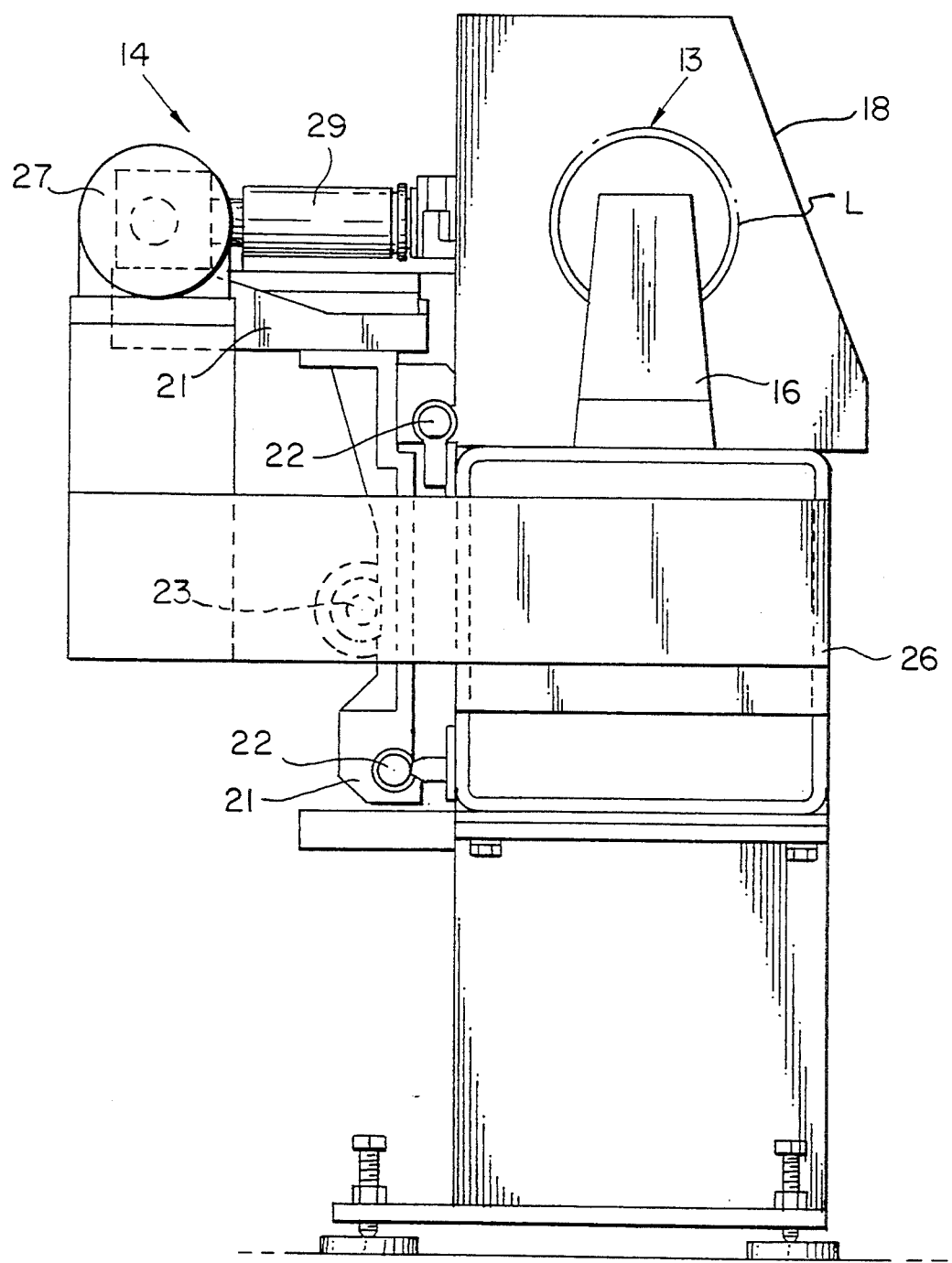
FIG. 6 shows a side view of the further exposure device according to FIG. 5.

FIGS. 5 and 6 show a stationary argon laser 27 which is disposed on the tailstock-side end of the rotary exposure machine 14 via a console 30. Instead of the argon laser it is of course also possible to employ another UV laser emitting in the region from 200 to 400 nm, for example a noble-gas ion laser, a dye or excimer laser, a nitrogen laser and the like.

For the purpose of point-wise exposure of the round mould 13 in the focal point of the UV optics 29, the laser radiation is switched on or off e.g. via an acoustooptical modulator. For the present purposes, quartz glass will preferably be employed as the interaction or switching medium, as it is transparent for light from a wavelength of 200 nm and also has a sufficiently high speed of sound which is required for sufficiently rapid switching of the modulator. While it will be most expedient to use the first order beam, that is the beam reflected at the compression zones in the interaction medium, as this makes it possible to attain a 0:100 scanning ratio of the beam power, it is entirely conceivable, on the other hand, to employ the 0th order beam for the surface exposure of the round mould 13 and to put up with the partial pre-cross-linking caused thereby at the locations which are intended to remain unexposed. The development process for the photopolymers which essentially consists of removing the non-crosslinked polymers from the surface film by dissolution is quite capable even of dissolving partially cross-linked locations.

Figure 7:
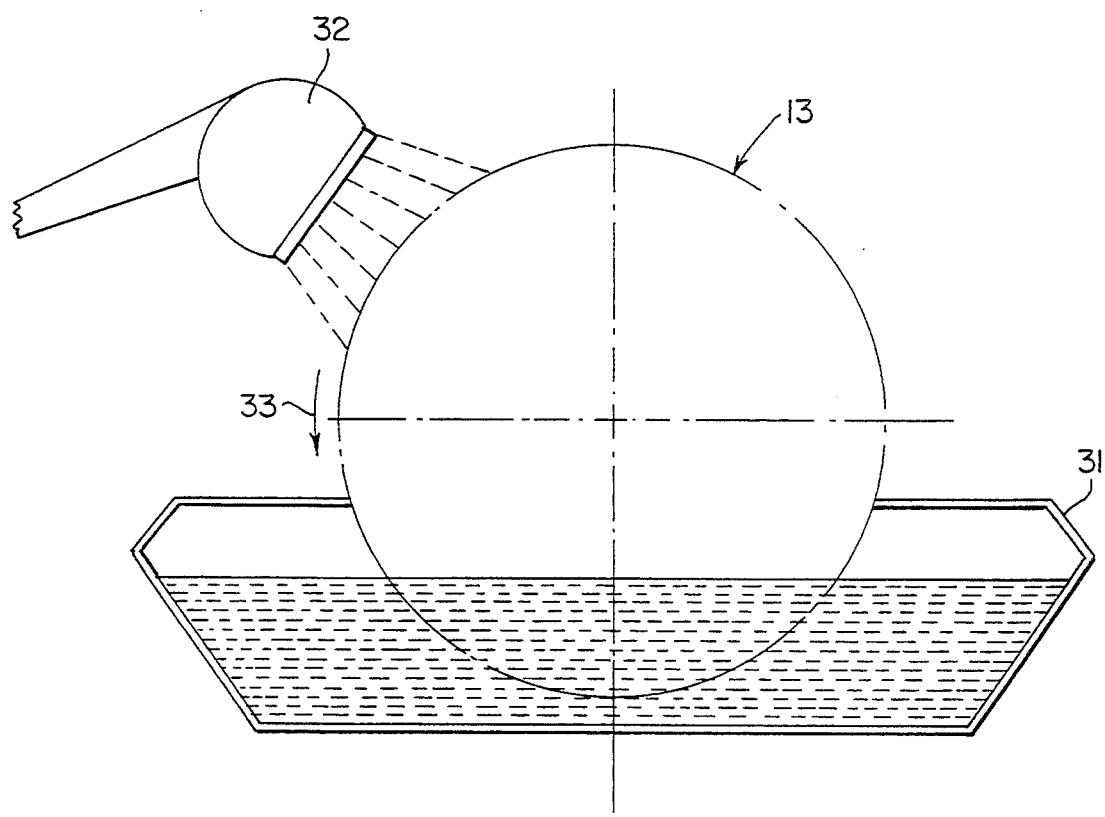
FIG. 7 shows a process step for developing the exposed photosensitive coating layer.

The last process step, which has just also been touched upon, is shown in diagrammatic form in FIG. 7. The round mould 13 is immersed in a developer medium which is held in a vat 31, and as-a result the locations not cross-linked by the action of the light are removed by dissolution from the photopolymer layer lying on the round screen 1. Expediently, the developer liquid may comprise an alkaline solution (soda, aqueous potassium hydroxide, aqueous sodium hydroxide). The development process can be assisted by spraying fresh developer solution from a shower 32 onto the surface of the round mould 13. During the development process, the round mould rotates in the direction of the arrow 33.

I claim:

1. A rotary exposure machine (14), comprising:
   a guide bed (26);
   means (15, 16) for rotably supporting a round screen (1) on said guide bed (26);
   driving means (19, 20) for rotably driving said round screen (1);
   an optical slide (21) moved along guides (22) while the round screen (1) is turning, said guides (22) are mounted on said guide bed (26); and
   a laser (27) for exposing a photosensitive coating layer (L) provided on the outer surface of said round screen (1), wherein
   said laser (27) is carried along with the optical slide (21).

2. The rotary exposure machine (14) as claimed in claim 1, wherein a laser beam of said laser (27) is deflected, via a tilted mirror (28), from the originally vertical direction into a horizontal direction, so that it is then focused, via an optic (29), radially onto the surface of said round screen (1).

3. The rotary exposure machine (14) as claimed in claim 1, wherein the laser (27) is an UV-laser emitting in the region of 200 nm to 400 nm.

4. The rotary exposure machine (14) as claimed in claim 2, wherein the laser (27) is an UV-laser emitting in the region of 200 nm to 400 nm.

5. The rotary exposure machine (14) as claimed in claim 1, wherein the optical slide (21) is moved with the aid of a feed screw (23).

6. The rotary exposure machine (14) as claimed in claim 2, wherein the optical slide (21) is moved with the aid of a feed screw (23).

7. The rotary exposure machine (14) as claimed in claim 3, wherein the optical slide (21) is moved with the aid of a feed screw (23).

8. The rotary exposure machine (14) as claimed in claim 4, wherein the feed screw (23) is coupled with a step motor (24).

9. The rotary exposure machine (14) as claimed in claim 5, wherein on the free shaft of the step motor (24), a torsional-vibration damper (25) is mounted.

* * * * *